(12) United States Patent
Iwamizu

(10) Patent No.: US 9,520,789 B2
(45) Date of Patent: Dec. 13, 2016

(54) POWER SUPPLY DEVICE

(71) Applicant: FUJI ELECTRIC CO., LTD., Kawasaki-shi (JP)

(72) Inventor: Morio Iwamizu, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 156 days.

(21) Appl. No.: 14/508,829

(22) Filed: Oct. 7, 2014

(65) Prior Publication Data

US 2015/0123637 A1 May 7, 2015

(30) Foreign Application Priority Data

Nov. 7, 2013 (JP) ................................. 2013-231299

(51) Int. Cl.
*H02P 7/29* (2016.01)
*H02M 3/158* (2006.01)
*H03K 17/081* (2006.01)
*H02M 1/00* (2006.01)
*H02M 3/155* (2006.01)

(52) U.S. Cl.
CPC ........... *H02M 3/1588* (2013.01); *H02M 3/155* (2013.01); *H02P 7/29* (2013.01); *H03K 17/08104* (2013.01); *H02M 2001/0048* (2013.01); *H02M 2003/1555* (2013.01); *Y02B 70/1491* (2013.01)

(58) Field of Classification Search
CPC ................................ H02P 7/29; H02M 3/1588
USPC .......................... 318/727, 400.3, 400.01, 700
See application file for complete search history.

(56) References Cited

U.S. PATENT DOCUMENTS

| | | | | |
|---|---|---|---|---|
| 3,760,247 A | * | 9/1973 | Trouilhet | .................. H02P 1/42 318/797 |
| 4,017,777 A | * | 4/1977 | Bailey | ....................... B60L 9/12 363/124 |
| 4,495,557 A | * | 1/1985 | Weit | ..................... H02M 7/1623 363/10 |
| 5,990,644 A | * | 11/1999 | Furuya | .................. H02P 7/0044 257/546 |
| 2006/0103428 A1 | | 5/2006 | Shimada | |
| 2007/0014064 A1 | | 1/2007 | Souma | |

(Continued)

FOREIGN PATENT DOCUMENTS

| | | |
|---|---|---|
| JP | 2006-148323 A | 6/2006 |
| JP | 2007-028747 A | 2/2007 |
| JP | 2009-130949 A | 6/2009 |

*Primary Examiner* — David S Luo
(74) *Attorney, Agent, or Firm* — Rabin & Berdo, P.C.

(57) ABSTRACT

A power supply device includes an output semiconductor element and a clamp circuit. The output semiconductor element is provided between a power supply line and an output terminal. The output semiconductor element is driven and switched so as to supply electric power to an inductive load connected to the output terminal. The clamp circuit clamps a voltage applied between the power supply line and the output terminal due to a counter electromotive force generated in the inductive load when the output semiconductor element turns OFF, with reference to an operation reference voltage of the output semiconductor element. Thus, it is possible to provide a power supply device including a clamp circuit which can effectively clamp a negative voltage surge derived from a counter electromotive force generated in an inductive load, at a low clamp voltage.

8 Claims, 11 Drawing Sheets

(56) References Cited

U.S. PATENT DOCUMENTS

2009/0128973 A1  5/2009  Nakahara

* cited by examiner

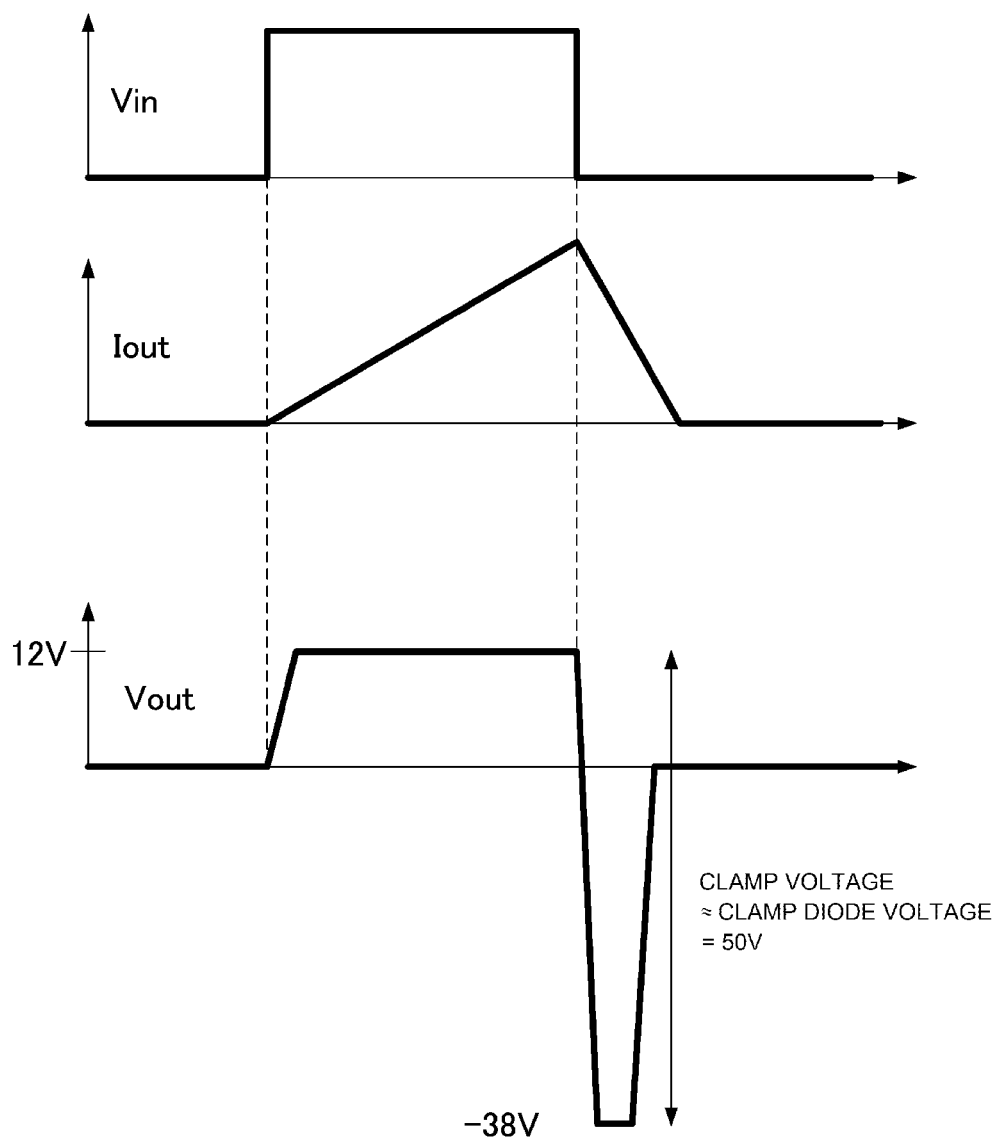

POWER SUPPLY DEVICE

CROSS-REFERENCE TO RELATED APPLICATION

This application claims the benefit of foreign priority of Japanese application 2013-231299, filed on Nov. 7, 2013. The disclosure of this earlier application is hereby incorporated herein by reference.

BACKGROUND OF THE INVENTION

1. Field of the Invention

The present invention relates to a power supply device which supplies electric power to an inductive load such as a motor.

2. Description of the Background Art

FIG. 10 is a diagram of the schematic configuration of a representative power supply device 1 according to the background art. The power supply device 1 has an output semiconductor element Q1 provided between a power supply line VCC and an output terminal OUT. A positive power supply voltage Vcc is supplied from a power supply BAT to the power supply line VCC. An inductive load RL such as a motor is connected to the output terminal OUT. Incidentally, the output semiconductor element Q1 consists of an insulated-gate type semiconductor element such as a power metal-oxide-semiconductor field-effect transistor (MOS-FET) or an insulated-gate bipolar transistor (IGBT) which can switch high electric power.

A gate voltage of the output semiconductor element Q1 is controlled by a drive circuit 3 provided in a control circuit 2 which is, for example, implemented as an integrated circuit. Thus, the output semiconductor element Q1 is driven and switched to control electric power supplied to the inductive load RL. The control circuit 2 imports a control signal, which is, for example, given from a microcomputer MC through an input terminal IN, to a logic circuit 4, in which a gate control signal for the output semiconductor element Q1 is generated.

Here, the logic circuit 4 receives an output of an overvoltage detection circuit 5, an output of a load release detection circuit 6 and an output of an overcurrent detection circuit 7 to control the generation of the gate control signal. The overvoltage detection circuit 5 monitors the power supply voltage Vcc. The load release detection circuit 6 monitors a voltage of the output terminal OUT. The overcurrent detection circuit 7 is configured to monitor a current flowing into the output semiconductor element Q1 from an output of a current detection semiconductor element Q2. For example, the current detection semiconductor element Q2 consists of an MOS-FET and is provided in parallel with the output semiconductor element Q1. Incidentally, the reference numeral 8 designates an internal power supply circuit which is incorporated into the control circuit 2 so that an internal power supply required for operating the control circuit 2 can be generated from the power supply voltage Vcc.

The control circuit 2 level-shifts the gate control signal, which is generated in the logic circuit 4, through the drive circuit 3 and applies the level-shifted gate control signal to a gate of the output semiconductor element Q1. Based on the gate control signal, the output semiconductor element Q1 is driven and switched. Incidentally, the gate control signal is also applied to a gate of the current detection semiconductor element Q2. Thus, the output semiconductor element Q1 and the current detection semiconductor element Q2 turn ON/OFF in linkage with each other.

When the output semiconductor element Q1 turns off, a counter electromotive force caused by an inductance component of the inductive load RL is generated in the inductive load RL. A negative voltage surge derived from the counter electromotive force is applied to the output terminal OUT. Incidentally, when the negative voltage surge exceeds a breakdown withstand voltage of the output semiconductor element Q1, the output semiconductor element Q1 breaks down. Then, the output semiconductor element Q1 deteriorates due to a breakdown current flowing into the output semiconductor element Q1. Therefore, there is a fear that the output semiconductor element Q1 may be thermally destructed.

In order to prevent such a problem, for example, a clamp circuit 9 is provided between the power supply line VCC, to which the power source voltage Vcc is supplied, and the gate of the output semiconductor element Q1, as shown in FIG. 10. The clamp circuit 9 is constituted, for example, by a Zener diode ZD and a diode D which are connected in series. The clamp circuit 9 serves for clamping the negative voltage surge applied to the output terminal OUT with reference to the power supply voltage Vcc. The clamp circuit 9 which clamps the negative voltage surge applied from the inductive load RL in this manner to protect the output semiconductor element Q1 has been introduced in detail, for example, in JP-A-2007-28747, JP-A-2006-148323, JP-A-2009-130949, etc.

Incidentally, when the clamp circuit 9 operates due to the negative voltage surge, a drain-source voltage of the output semiconductor element Q1 reaches the sum of a clamp voltage of the clamp circuit 9 and a threshold voltage of the output semiconductor element Q1, for example, as disclosed in paragraph [0007] of JP-A-2007-28747.

Assume that the output semiconductor element Q1 performs switching operation at the highest rated voltage. In this case, a clamp voltage which is almost as high as the highest rated voltage of the output semiconductor element Q1 is required in the clamp circuit 9 when the negative voltage surge is clamped with reference to the power supply voltage Vcc as described above. Such a high clamp voltage is intended to prevent the output semiconductor element Q1 from turning on in error due to a damp surge. Incidentally, the damp surge means a positive voltage surge applied to the power supply line VCC of the power supply device 1 when a terminal of the power supply BAT is detached from an alternator of a car in the case where, for example, the power supply device 1 is applied to the car.

In the case where, for example, the highest rated voltage of the output semiconductor element Q1 is 50V, a clamp voltage (withstand voltage) of about 50V is required in the diodes constituting the clamp circuit 9. Accordingly, when the clamp voltage set by the clamp circuit 9 is set at 50V with reference to the power supply voltage Vcc as shown in FIG. 11, the negative voltage surge applied to the output terminal OUT, from which, for example, an output voltage Vout can be obtained, can be clamped at −38V if the threshold voltage of the output semiconductor element Q1 is neglected.

Incidentally, FIG. 11 shows the relation between an output current Iout of the output semiconductor element Q1 and the voltage Vout of the output terminal OUT in the power supply device 1 from which an output voltage Vout of 12V can be obtained when the output semiconductor element Q1 turns ON. On the assumption that, for example, a variation in characteristics of the Zener diode ZD and the diode D constituting the clamp circuit 9 is 10% in this case, the clamp voltage may vary in the range of from 45V to 55V. In addition, when the clamp voltage is high, clamp resistance (which will be described later) during clamp operation of the clamp circuit 9 is reduced. Therefore, there also arises a problem that required characteristics of the output semiconductor element Q1 or the diodes constituting the clamp circuit 9 become strict to thereby adversely affect the cost.

SUMMARY OF THE INVENTION

The invention has been accomplished in consideration of such circumstances. An object of the invention is to provide a power supply device provided with a clamp circuit which can effectively clamp a negative voltage surge derived from a counter electromotive force generated in an inductive load, at a low clamp voltage.

In order to achieve the aforementioned object, a power supply device according to the invention includes:

an output semiconductor element which can, for example, switch high electric power, which is provided between a power supply line and an output terminal and which is driven and switched so as to supply electric power to an inductive load connected to the output terminal; and a clamp circuit which clamps a voltage applied between the power supply line and the output terminal due to a counter electromotive force with reference to an operation reference voltage of the output semiconductor element, the counter electromotive force being generated in the inductive load when the output semiconductor element turns OFF.

Incidentally, the output semiconductor element consists of an insulated-gate type semiconductor element such as a power MOS-FET or an IGBT.

Preferably, the clamp circuit is configured to include a switch semiconductor element and an operation voltage setting diode. For example, the switch semiconductor element consists of an MOS-FET. The switch semiconductor element is connected between a gate of the power MOS-FET or IGBT serving as the output semiconductor element and the power supply line through a reverse flow preventing diode. The operation voltage setting diode determines an ON-operation voltage of the switch semiconductor element with reference to the operation reference voltage of the insulated-gate type semiconductor element.

Incidentally, the clamp circuit further includes a resistor and a reverse flow protecting diode. The resistor pulls down a gate voltage of the insulated-gate type semiconductor element to a voltage of the output terminal. The reverse flow protecting diode prevents a reverse flow of a current through the resistor.

In addition, the clamp circuit further includes a first control semiconductor element and a second control semiconductor element. The first control semiconductor element cuts off the switch semiconductor element from the power supply line when the power supply line turns to a low voltage. The second control semiconductor element is connected between the gate of the insulated-gate type semiconductor element and the power supply line through a clamp voltage setting diode in place of the switch semiconductor element.

Incidentally, the second control semiconductor element clamps a voltage applied between the power supply line and the output terminal at a voltage set by the clamp voltage setting diode with reference to the voltage of the power supply line when the power supply line turns to a low voltage.

Here, when the output semiconductor element is an n-channel type power MOS-FET or IGBT and the switch semiconductor element is an n-channel type MOS-FET, p-channel type MOS-FETs controlled to turn ON/OFF complementarily are preferably used as the first and second control semiconductor elements.

Incidentally, when the output semiconductor element consists of an insulated-gate type semiconductor element to a gate of which a control voltage is applied through a gate resistor so that the insulated-gate type semiconductor element can turn ON/OFF to switch high electric power, the insulated-gate type semiconductor element is preferably provided with a discharge circuit which discharges charges accumulated in the gate of the insulated-gate type semiconductor element when the insulated-gate type semiconductor element turns OFF. In this case, the clamp circuit may be implemented as a diode which is provided between a ground line defining an operation reference voltage of the insulated-gate type semiconductor element and the gate of the insulated-gate type semiconductor element and which clamps a gate voltage of the insulated-gate type semiconductor element.

The power supply device having the aforementioned configuration is configured to include a clamp circuit which performs clamp operation on a voltage (i.e. a negative voltage surge) applied between the power supply line and an output terminal due to a counter electromotive force generated in an inductive load, with reference to an operation reference voltage of an output semiconductor element which is driven and switched. In other words, this kind of clamp circuit according to the background art is configured to exclusively clamp the negative voltage surge with reference to a power supply voltage Vcc. On the other hand, the clamp circuit in the invention is configured to clamp the negative voltage surge with reference to a ground potential serving as the operation reference voltage of the output semiconductor element.

Accordingly, the negative voltage surge applied to the output terminal from the inductive load can be clamped with reference to the ground potential so that a clamp voltage of clamp operation performed by the clamp circuit can be set to be, for example, as low as about 5V. As a result, clamp resistance in the clamp circuit can be increased sufficiently. In addition, a variation of the clamp voltage caused by a variation of characteristics of elements constituting the clamp circuit can be suppressed. Further, even when a damp surge is applied to the power supply line, the clamp circuit only performs clamp operation with reference to the ground potential. Therefore, there is an advantage that malfunctioning caused by the damp surge can be prevented.

BRIEF DESCRIPTION OF THE DRAWINGS

FIG. 11 is a waveform chart showing clamp operation of a clamp circuit on a negative voltage surge in the background-art power supply device shown in FIG. 10.

DETAILED DESCRIPTION OF THE INVENTION

Power supply devices according to embodiments of the invention will be described below with reference to the drawings.

Figure 1:
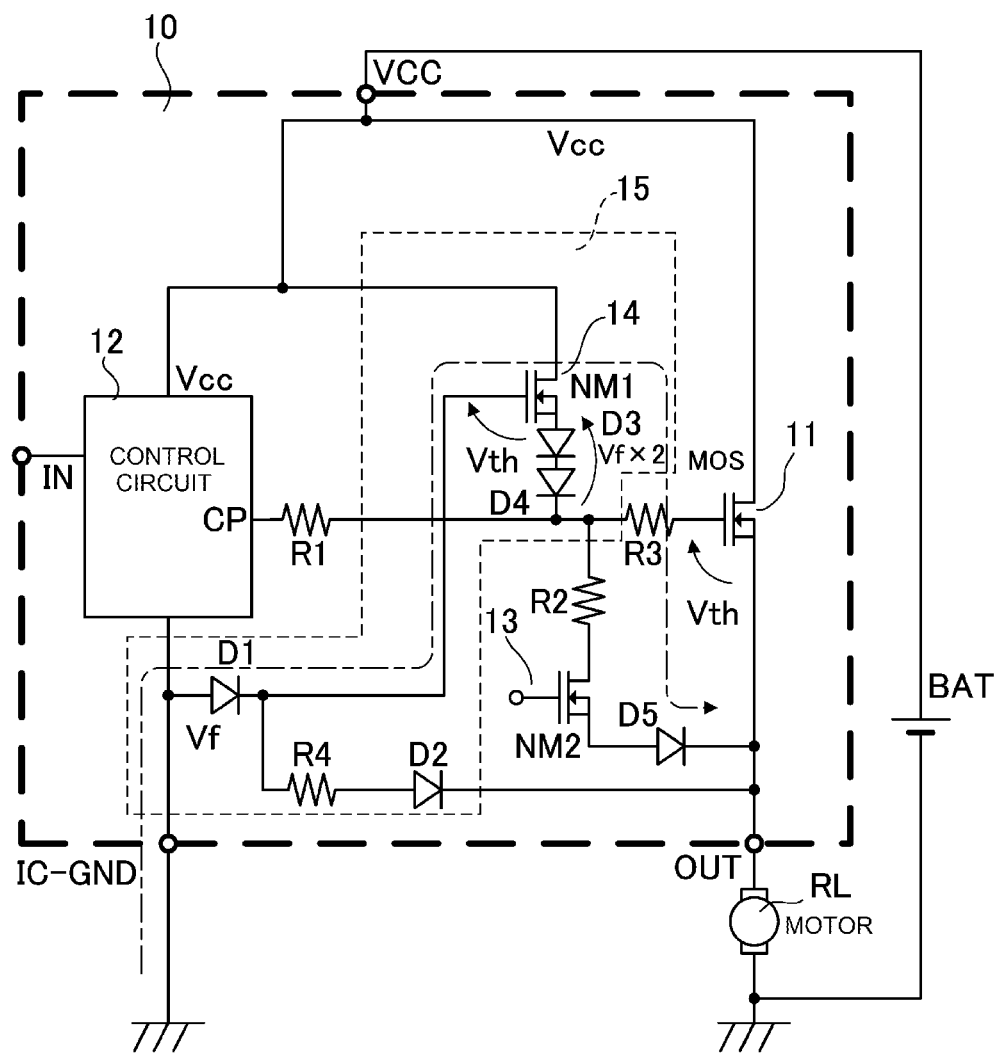
FIG. 1 is a diagram of the schematic configuration of a main part of a power supply device according to a first embodiment of the invention.

FIG. 1 is a diagram of the schematic configuration of a main part of a power supply device 10 according to a first embodiment of the invention. The reference numeral 11 designates an output semiconductor element which is provided between a power supply line VCC and an output terminal OUT so as to be driven and switched. A positive power supply voltage Vcc of, for example, 12V is supplied from a power supply BAT to the power supply line VCC. The output semiconductor element 11 consists of an insulated-gate type semiconductor element which can switch high electric power, such as an n-channel type power MOS-FET or IGBT, preferably a trench-gate type MOS-FET.

Figure 10:
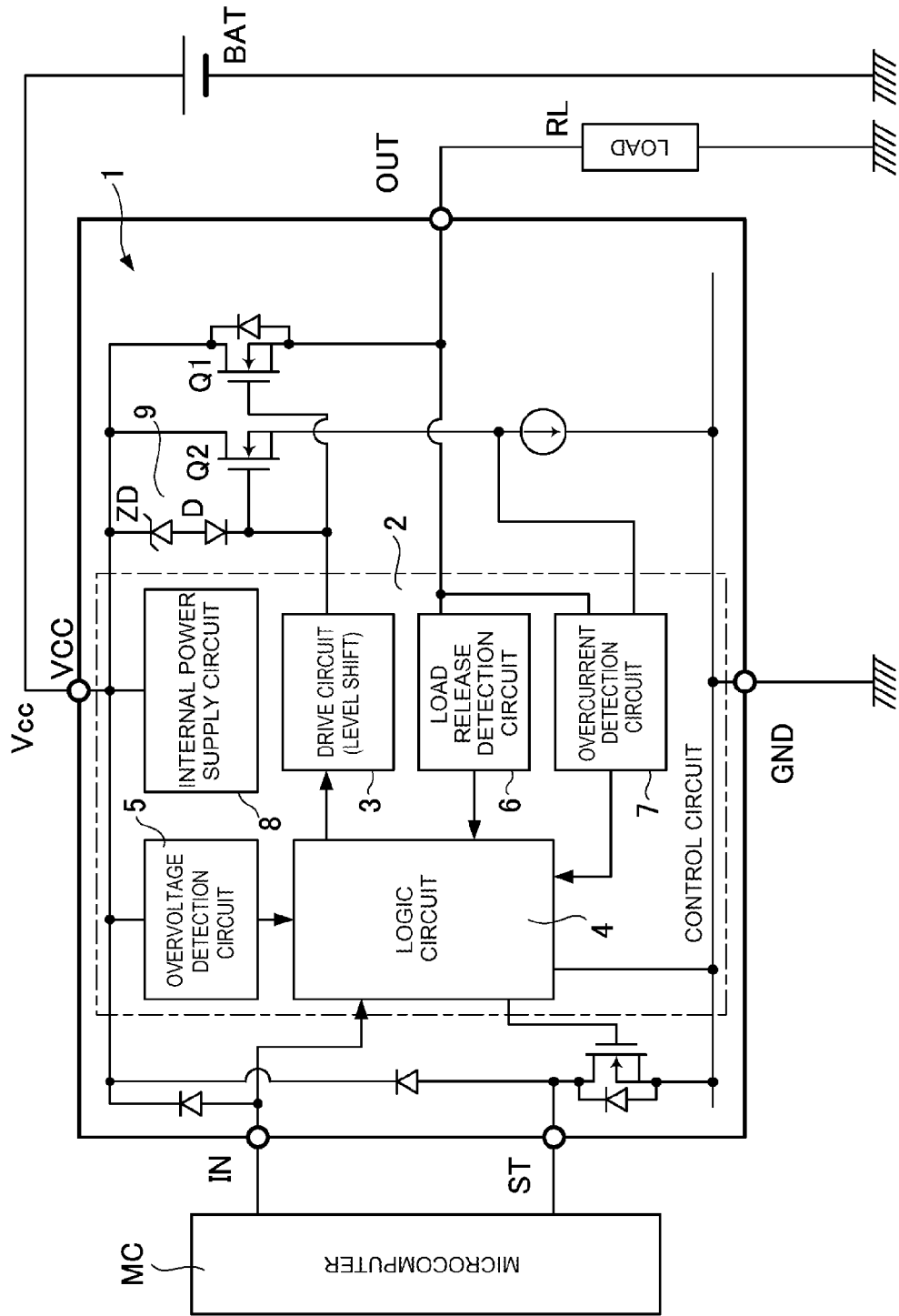
FIG. 10 is a diagram of the schematic configuration of a main part of a background-art power supply device.

A control circuit 12 constructed as an integrated circuit generates a gate control voltage, which is outputted through an output terminal CP of the control circuit 12, basically in a similar manner to the background-art power supply device 1 shown in FIG. 10. The output semiconductor element (MOS) 11 receives the gate control voltage at a gate thereof and performs a switching operation to control an output current to the output terminal OUT. Incidentally, the output semiconductor element 11 consisting of a power MOS-FET is provided to connect a drain thereof to the power supply line VCC and to connect a source thereof to the output terminal OUT. The output semiconductor element 11 receives the gate control voltage at the gate through resistors R1 and R3 which are connected in series, and performs an ON/OFF operation. Incidentally, for example, a motor serving as an inductive load RL is interposed between the output terminal OUT and a negative electrode line (ground line) of the power supply BAT.

In addition, a discharge control semiconductor element 13 is provided between a connection point between the resistors R1 and R3 and the output terminal OUT through a resistor R2. The discharge control semiconductor element 13 consists of an n-channel type MOS-FET (NM2). The discharge control semiconductor element 13 is driven to turn ON/OFF under the control of the control circuit 12. The discharge control semiconductor element 13 is driven to turn ON/OFF complementarily with the output semiconductor element (MOS) 11. Thus, the discharge control semiconductor element 13 serves for discharging charges accumulated in the gate of the output semiconductor element 11 when the output semiconductor element 11 turns OFF. Incidentally, a diode D5 for preventing a reverse flow of a current from the output terminal OUT is provided between a source of the discharge control semiconductor element 13 and the output terminal OUT.

On the other hand, a switch semiconductor element 14 consisting of an n-channel type MOS-FET (NM1) is provided between the gate of the output semiconductor element 11 and the power supply line VCC, to which the positive power supply voltage Vcc is supplied, through two diodes D3 and D4. Incidentally, the diodes D3 and D4 are interposed in series between a source of the switch semiconductor element 14 and the gate of the output semiconductor element 11. In addition, a gate of the switch semiconductor element 14 is connected to a ground line IC-GND of the control circuit 12 through a diode D1. The ground line IC-GND is set at ground potential defining an operation reference voltage for the control circuit 12 and the output semiconductor element 11, specifically, at the same potential as the negative electrode line of the power supply BAT.

Incidentally, the gate of the switch semiconductor element 14 is connected to the output terminal OUT through a resistor R4 so as to be pulled down to secure the gate potential of the switch semiconductor element 14. In addition, a diode D2 which prevents a reverse flow of a current into the gate of the switch semiconductor element 14 is interposed between the resistor R4 and the output terminal OUT. Incidentally, the resistor R4 consists of a resistor having a resistance value of, for example, about 200 kΩ. The switch semiconductor element 14 and the diodes D1, D2, D3 and D4 constitute a clamp circuit 15 which clamps a negative voltage surge applied to the output terminal OUT with reference to the ground potential.

According to the clamp circuit 15 configured as described above, when the negative voltage surge is applied to the output terminal OUT, the anode potential of the diode D3 is determined through the switch semiconductor element (NM1) 14 from the diode D1 with reference to the ground potential (0V). Further, the potential of the output terminal OUT is determined through the output semiconductor element (MOS) 11 from the diodes D3 and D4. The negative voltage surge applied to the output terminal OUT is clamped at a voltage dropped due to forward drop voltages Vf of the diodes D1, D3 and D4 and operation threshold voltages Vth of the output semiconductor element 11 and the switch semiconductor element 14 with reference to the ground potential (0V) corresponding to the potential of the ground line IC-GND.

In other words, the negative voltage surge applied to the output terminal OUT is clamped at a negative voltage [3×Vf+2×Vth] defined by the forward drop voltages Vf of the diodes D1, D3 and D4 and the operation threshold voltages Vth of the output semiconductor element 11 and the switch semiconductor element 14 with reference to the ground potential (0V) of the ground line IC-GND. Assume that each of the forward drop voltages Vf of the diodes D1, D3 and D4 is 0.6V, and each of the operation threshold voltages Vth of the MOS-FETs constituting the output semiconductor element 11 and the switch semiconductor element 14 is 1.8V. In this case, a clamp voltage set by the clamp circuit 15 is approximately −5.4V.

Figure 2:
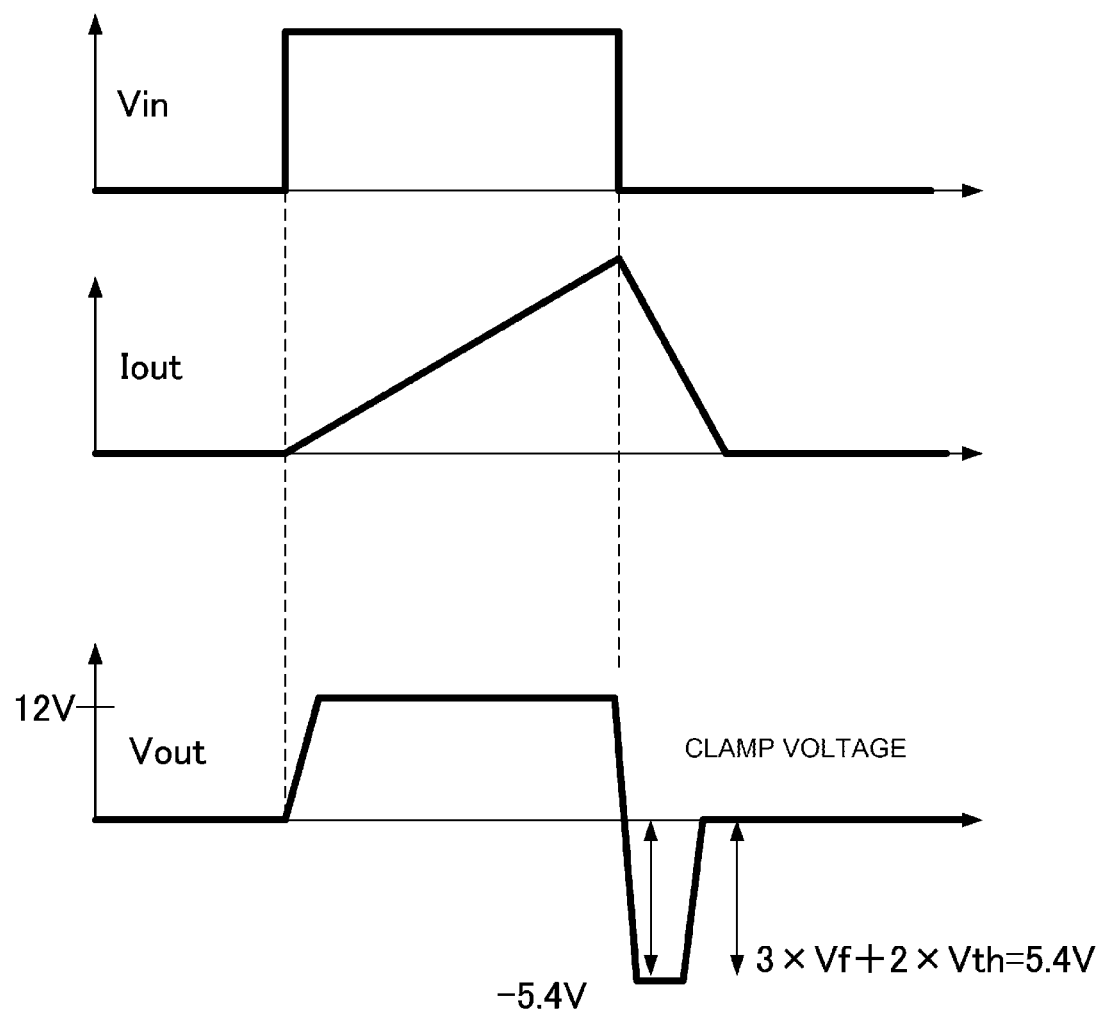
FIG. 2 is a waveform chart showing clamp operation of a clamp circuit on a negative voltage surge in the power supply device shown in FIG. 1.

That is, the negative voltage surge applied to the output terminal OUT due to a counter electromotive force generated in the inductive load RL is clamped at the clamp voltage of approximately −5.4V set by the clamp circuit 15 with reference to the ground potential (0V), as shown in FIG. 2. Accordingly, it will be sufficient if the withstand voltage of the elements constituting the clamp circuit 15, particularly the switch semiconductor element (NM1) 14 and the diodes D3 and D4 is set at about 17.4V which is the sum of the power supply voltage Vcc of 12V and the clamp voltage of 5.4V.

Further, according to the embodiment of the invention, there is no fear that the clamp circuit may turn ON the output semiconductor element 11 in error due to the aforementioned damp surge. Therefore, it is not necessary to set the withstand voltage of the clamp circuit 15 to be almost as high as the highest rated voltage of the output semiconductor element 11 as in the background art. Accordingly, the clamp circuit 15 having a low withstand voltage can protect the output semiconductor element 11 effectively from the negative voltage surge derived from the counter electromotive force generated in the inductive load RL.

In addition, even when there is a variation of 10% in each of the forward drop voltages Vf of the diodes D1, D3 and D4 forming the clamp circuit 15 and each of the operation threshold voltages Vth of the output semiconductor element 11 and the switch semiconductor element 14 in this case, the clamp voltage can be settled approximately in the range of from about 4.9V to about 5.9V. That is, a setting error of the clamp voltage can be suppressed to about ±0.5V. Accordingly, the setting error of the clamp voltage can be reduced to approximately 1/10 relative to about ±5V of the background-art power supply device 1 shown in FIG. 10.

Figure 3:
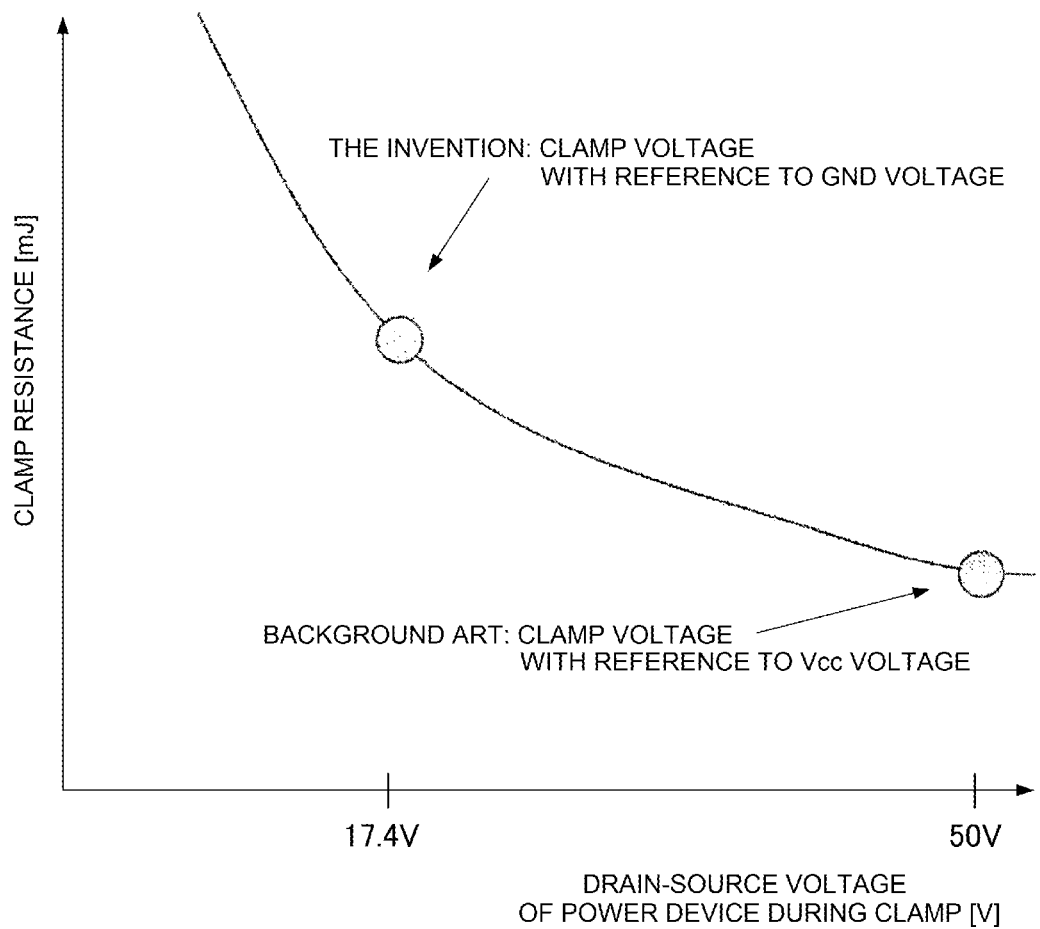
FIG. 3 is a graph showing the relation between a clamp voltage and clamp resistance.
Figure 4:
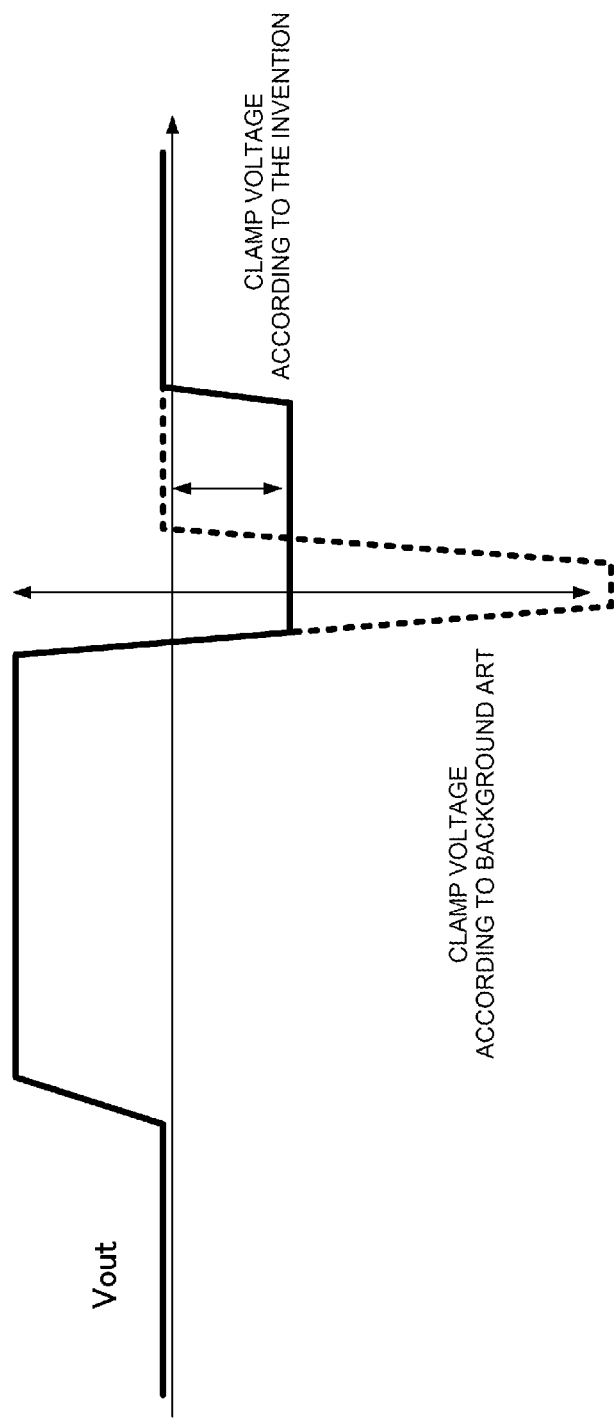
FIG. 4 is a chart showing the clamp voltage and a clamp operation waveform.

In addition, clamp resistance during clamp operation performed by the clamp circuit 15, that is, the total energy amount the output semiconductor element 11 must deal with due to the clamp operation largely depends on the clamp voltage, for example, as shown in FIG. 3. As the clamp voltage increases, the clamp resistance decreases. Thus, according to the clamp circuit 15 which sets the clamp voltage with reference to the ground voltage as in the invention, the clamp voltage against the negative voltage surge can be therefore set, for example, at about 17.4V which is greatly lower than the maximum rated voltage of the output semiconductor element 11, in comparison with the background-art clamp circuit 9 which sets the clamp voltage with reference to the power supply voltage Vcc. Therefore, as shown in an operating waveform during clamp in FIG. 4, the energy accumulated in the inductive load RL can be absorbed for a long time correspondingly to the clamp voltage which can be set low, so that the total energy amount which can be dealt with can be increased. Accordingly, as shown in FIG. 3, the clamp resistance can be increased correspondingly to the clamp voltage which can be set low.

Incidentally, in the power supply device 10 shown in FIG. 1, a minute current is supplied to the output terminal OUT from the ground line IC-GND through the resistor R4 when the negative voltage surge is clamped. Thus, the forward drop voltage Vf of the diode D1 is secured. However, the current flows into the output terminal OUT through the resistor R4 also during normal operation. Accordingly, it is desirable that the value of the resistor R4 is set large and the withstand voltage between the ground line IC-GND and the output terminal OUT is secured in the diode D2 if necessary.

In addition, as to the clamp voltage, for example, the voltage depending on the forward drop voltages Vf of the diodes may be adjusted by changing the number of diodes interposed in series between the source of the switch semiconductor element 14 and the gate of the output semiconductor element 11. Alternatively, the clamp voltage may be also set by adjusting the ON-operation threshold voltages Vth of the output semiconductor element 11 and the switch semiconductor element 14. In addition, the aforementioned diode D1 may be removed so that the gate of the switch semiconductor element 14 can be connected directly to the ground line IC-GND. In this case, the gate voltage of the switch semiconductor element 14 is fixed at the ground potential (0V) so that the resistor R4 and the diode D2 can be dispensed with.

In addition, each of the diodes D3 and D4 is provided for exhibiting a reverse flow preventing effect so as to prevent the current from flowing into an n-type semiconductor substrate connected to the power supply line VCC from the output terminal CP during normal operation. That is, a voltage higher than the power supply voltage Vcc is outputted from the output terminal CP in order to drive the output semiconductor element 11 which is an n-channel type MOS-FET. When the diodes D3 and D4 are not provided, this voltage higher than the power supply voltage Vcc is applied directly to a p-well region of the n-type semiconductor substrate where the switch semiconductor element 14 is formed. Accordingly, through the p-well region where the switch semiconductor element 14 is formed, the current flows into the n-type semiconductor substrate where the clamp circuit 15 is formed and which is connected to the power supply line VCC. The diodes D3 and D4 are provided in order to prevent this. Incidentally, the gate potential of the switch semiconductor element 14 during normal operation is lower than the source voltage given as the power supply voltage Vcc in this case. Accordingly, the switch semiconductor element 14 is OFF.

Here, when a back gate which is a substrate of the switch semiconductor element 14 per se constituted by the p-well region is connected to the output terminal OUT, an output from the output terminal CP is only connected to an n-type region which is a source-drain terminal of the switch semiconductor element 14. Then, a diode connected reversely is constituted by the n-type region and the p-well region of the n-type semiconductor substrate whose potential is equal to the potential of the output terminal OUT. Accordingly, reverse flow into the power supply line VCC does not have to be prevented. Accordingly, when there is no problem in setting the clamp voltage of the clamp circuit 15, the diodes D3 and D4 can be removed.

In some application to the power supply device 10, wiring of a control system to the ground line IC-GND in the power supply device 10 and the ground line connecting the inductive load RL connected to the output terminal OUT and the negative electrode of the power supply BAT may be laid separately.

When, for example, a circuit between the ground line IC-GND and the ground line on the negative electrode side of the power supply BAT is made open in such an application, the current from the microcomputer MC side may flow into the ground line IC-GND. Then, the ground line IC-GND is pulled up by the current flowing into the ground line IC-GND. In accordance with this, the switch semiconductor element 14 may turn ON and further the output semiconductor element 11 may turn ON. In this case, there is a fear that the output semiconductor element 11 may be thermally destructed. Specifically, in this embodiment, the clamp voltage is set at −5.4V. Accordingly, there is a possibility that the output semiconductor element 11 may be thermally destructed when the ground line IC-GND is pulled up to be not lower than −5.4V. When such an application is assumed, it is desirable that the power supply device is configured as shown in FIG. 5.

Figure 5:
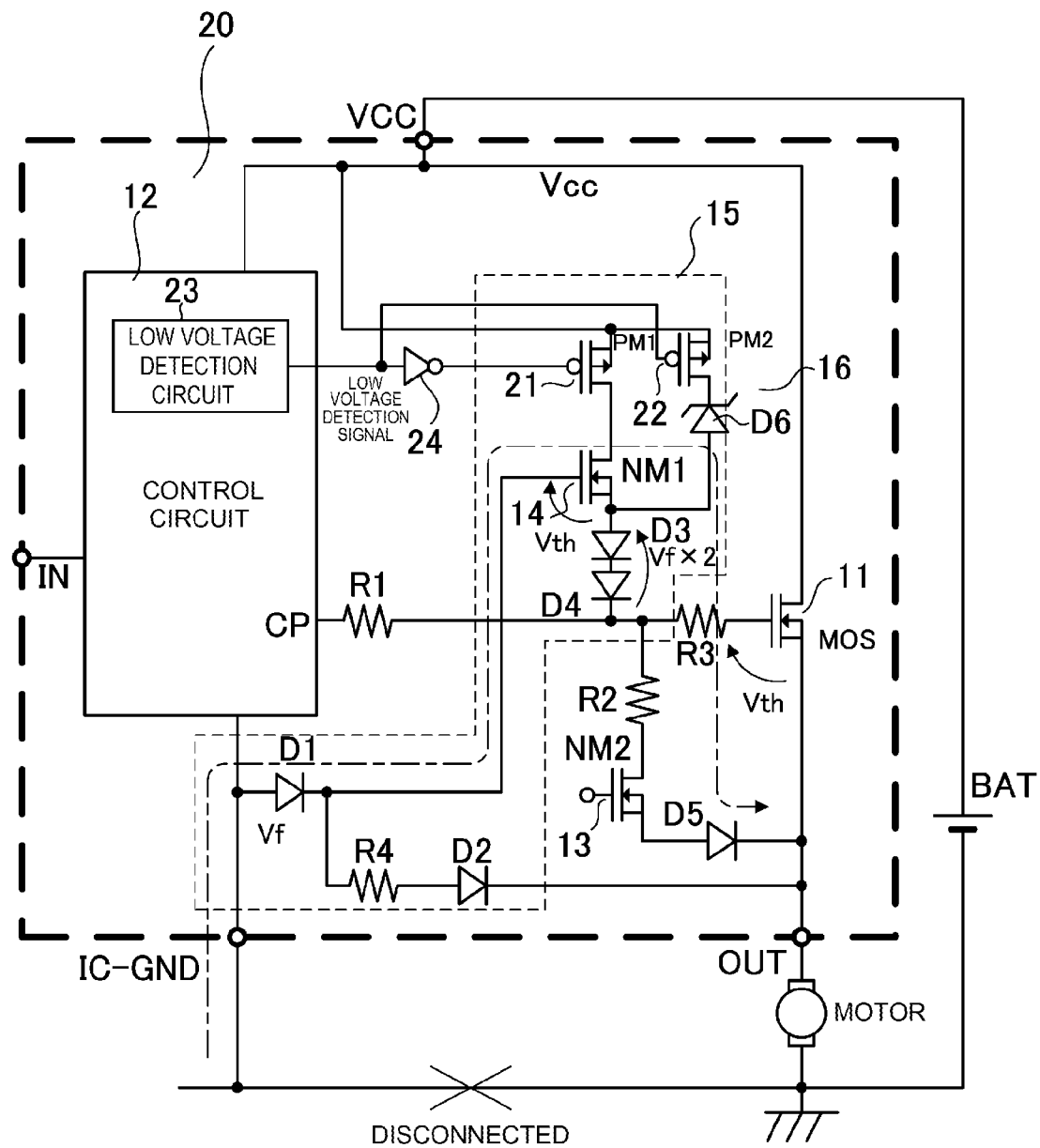
FIG. 5 is a diagram of the schematic configuration of a main part of a power supply device according to a second embodiment of the invention.

FIG. 5 is a diagram of the schematic configuration of a main part of a power supply device 20 according to a second embodiment of the invention. The same portions as those in the power supply device 10 shown in FIG. 1 will be given the same reference numerals correspondingly so that detailed description thereof can be omitted.

The power supply device 20 has a first control semiconductor element 21 and a second control semiconductor element 22. The first control semiconductor element 21 is provided between the drain of the switch semiconductor element 14 and the power supply line VCC. The second control semiconductor element 22 is provided between the source of the switch semiconductor element 14 and the power supply line VCC through a clamp voltage setting Zener diode D6 constituting a second clamp circuit 16. For example, these first and second control semiconductor elements 21 and 22 consist of p-channel type MOS-FETs (PM1 and PM2).

In addition, a low voltage detection circuit 23 for detecting relative decrease of the power supply voltage Vcc caused by the pull-up of the ground line IC-GND is provided in the control circuit 12. A low voltage detection signal detected by the low voltage detection circuit 23 is configured to be inputted directly to a gate of the second control semiconductor element 22 and applied to a gate of the first control semiconductor element 21 through an inverting circuit 24. In other words, the first and second control semiconductor elements (PM1 and PM2) 21 and 22 are driven to turn ON/OFF complementarily in accordance with the low voltage detection signal.

Incidentally, the voltage detected by the low voltage detection circuit 23 must be set at a voltage value with which the relative decrease of the power supply voltage Vcc caused by the pull-up of the ground line IC-GND can be surely detected. In addition, the voltage of the ground line IC-GND when the ground line IC-GND is open can be surely pulled up by the increase of impedance of the resistor R4, the increase of a static power supply current of the control circuit 12, the adjustment of impedance of the microcomputer MC, etc. Incidentally, preferably, the voltage detected by the low voltage detection circuit 23 is set at a voltage as low as possible for the following reason. Here, for simplification, description will be made on the assumption that the voltage detected by the low voltage detection circuit 23 is 5V.

Incidentally, the first control semiconductor element (PM1) 21 serves for cutting off the switch semiconductor element (NM1) 14 from the power supply line VCC when the power supply line VCC turns to a low voltage. In addition, the second control semiconductor element (PM2) 22 serves for interposing the Zener diode D6 between the gate of the output semiconductor element (MOS) 11 and the power supply line VCC in place of the switch semiconductor element 14 and in addition to the diodes D3 and D4 so that the Zener diode D6 can be connected in series with the diodes D3 and D4.

According to the power supply device 20 configured thus, when the potential of the ground line IC-GND is pulled up by the current flowing from the microcomputer MC side due to the opening of the ground wiring. The relative decrease of the power supply voltage Vcc caused by the pull-up of the potential of the ground line IC-GND is detected by the low voltage detection circuit 23. When the low voltage is detected, the switch semiconductor element (NM1) 14 is cut off due to complementary ON/OFF operations of the aforementioned first and second control semiconductor elements (PM1 and PM2) 21 and 22. The Zener diode D6 and the diodes D3 and D4 are interposed in series between the gate of the output semiconductor element (MOS) 11 and the power supply line VCC.

A series circuit consisting of the Zener diode D6 and the diodes D3 and D4 serves as a clamp circuit which clamps the negative voltage surge with reference to the power supply voltage Vcc in a similar manner to the background-art power supply device 1 shown in FIG. 10. The clamp voltage in this case is approximately 23V which is the sum of the forward drop voltages Vf of the diodes D3 and D4 and the operation threshold voltage Vth of the output semiconductor element (MOS) 11 when a Zener breakdown voltage of the Zener diode D6 is 20V.

Accordingly, when the power supply voltage Vcc relatively decreases due to the pull-up of the potential of the ground line IC-GND, the switch semiconductor element (NM1) 14 is cut off from the power supply line VCC by the first control semiconductor element (PM1) 21 in response to the detection result of the low voltage detection circuit 23. Thus, the output semiconductor element 11 can be prevented from turning ON. In the embodiment, the clamp voltage is 23V. Accordingly, the effect can be obtained during the opening of the ground line IC-GND when the power supply voltage of the power supply BAT is not higher than 23V.

When the invention is applied to a case where the power supply voltage of the power supply BAT is further higher, the invention can cope with the case if the withstand voltage of the Zener diode D6 is increased or a plurality of Zener diodes D6 are connected in series.

Incidentally, in the normal operation in which the circuit between the ground line IC-GND and the negative electrode side of the power supply BAT is not open, a low voltage is detected also when the power supply voltage Vcc per se decreases. Therefore, the switch semiconductor element 14 can be cut off in such a case. The clamp circuit consisting of the Zener diode D6 and the diodes D3 and D4 is connected to the gate of the output semiconductor element (MOS) 11. In this case, the clamp voltage is 23V with reference to the power supply line VCC.

However, the energy accumulated in the inductive load RL also decreases in accordance with the substantial decrease of the power supply voltage Vcc. Accordingly, the clamp resistance should not be a practical problem. In other words, when the power supply voltage of the power supply BAT is not lower than 5V and high clamp resistance is required, the clamp voltage is set at −5.4V with reference to the ground line IC-GND. When the power supply voltage of the power supply BAT is not lower than 5V and high clamp resistance is not required, the clamp voltage is set at −23V with reference to the power supply line VCC. Incidentally, the low voltage detection value for changing over the operation may be changed by the specifications. The withstand voltage of the Zener diode D6 may be also decreased by the specifications.

Figure 6:
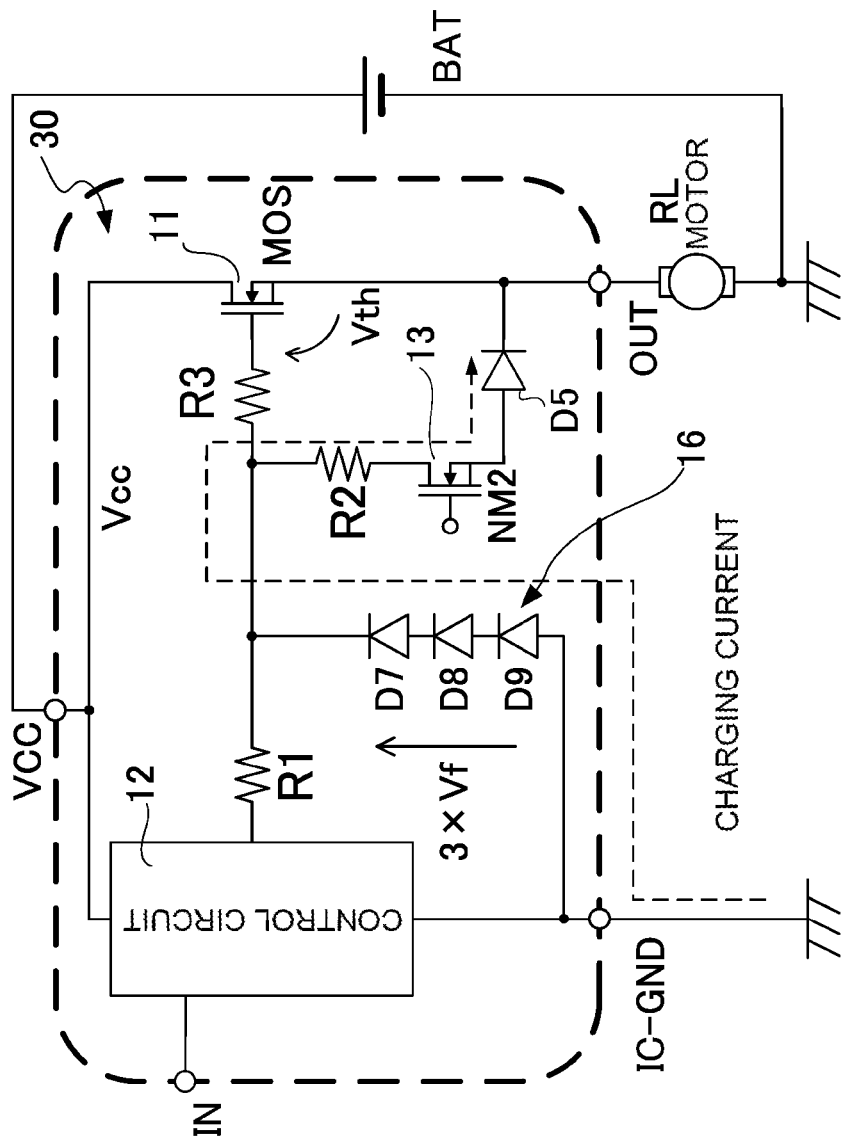
FIG. 6 is a diagram of the schematic configuration of a main part of a power supply device according to a third embodiment of the invention.

On the other hand, the clamp voltage with reference to the ground voltage (0V) serving as the operation reference voltage of the output semiconductor element (MOS) 11 may be set by a clamp circuit which is configured, for example, as shown in FIG. 6. FIG. 6 is a diagram of the schematic configuration of a main part of a power supply device 30 according to a third embodiment of the invention. The same portions as those in the power supply device 10 shown in FIG. 1 will be given the same reference numerals correspondingly so that detailed description thereof can be omitted.

Figure 7:
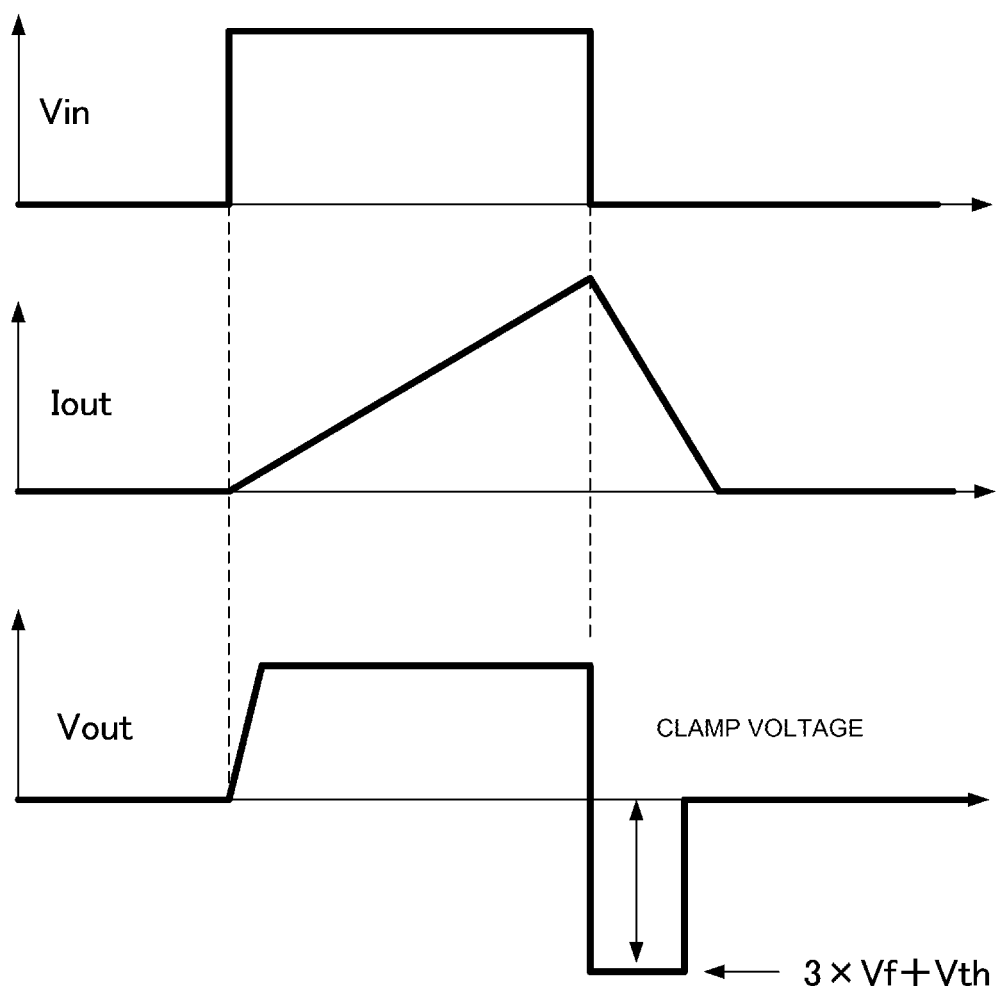
FIG. 7 is a waveform chart showing clamp operation of a clamp circuit on a negative voltage surge in the power supply device shown in FIG. 6.

For example, the power supply device 30 includes three diodes D7, D8 and D9 which are connected in series and interposed between the ground line IC-GND of the control circuit 12 and the gate of the output semiconductor element (MOS) 11. These diodes D7, D8 and D9 serve for clamping a negative voltage surge applied to the output terminal OUT, through the output semiconductor element (MOS) 11. Incidentally, the clamp circuit 16 configured thus clamps the negative voltage surge at a voltage [3×Vf+Vth] determined based on forward drop voltages Vf of the three diodes D7, D8 and D9 and the operation threshold voltage Vth of the output semiconductor element (MOS) 11 with reference to the ground potential (0V) of the ground line IC-GND, as shown in FIG. 7.

Also when the clamp circuit 16 is configured thus, a similar effect to that according to the aforementioned first embodiment can be achieved. In addition, according to the third embodiment, the circuit configuration of the power supply device 30 can be simplified due to removal of the switch semiconductor element 14 in the aforementioned first embodiment.

Figure 8:
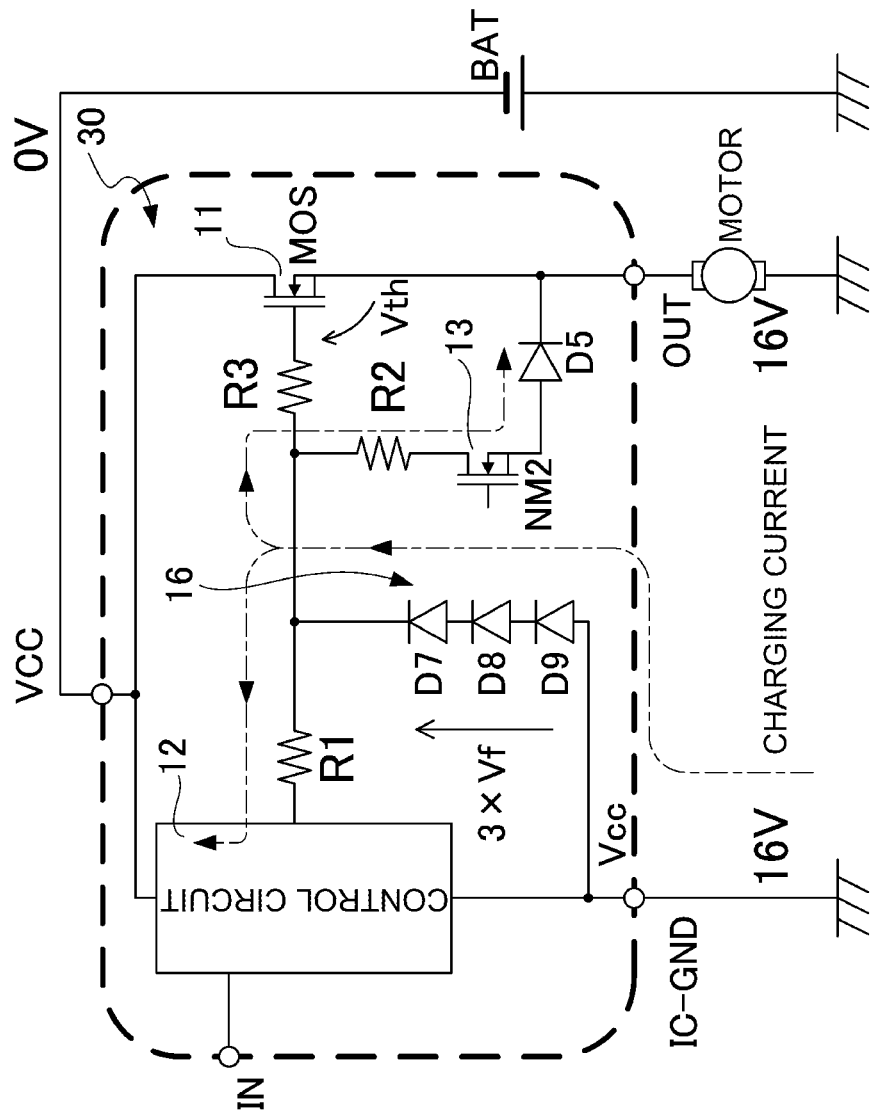
FIG. 8 is a view showing operation when the power supply device shown in FIG. 6 is reversely connected to a power supply.

In addition, in the aforementioned configuration, the output semiconductor element (MOS) 11 can be prevented from being thermally destructed even when, for example, the power supply device 30 is reversely connected to the power supply BAT. That is, when the power supply device 30 is reversely connected to the power supply BAT, a positive power supply voltage Vcc is applied to the ground line IC-GND. The current from the power supply BAT branches and flows into the control circuit 12 and the output terminal OUT through the discharge control semiconductor element (NM2) 13 after passing through the diodes D7, D8 and D9 as shown in FIG. 8.

In addition, a part of the current flows into the gate of the output semiconductor element (MOS) 11. Then, the output semiconductor element (MOS) 11 whose gate is injected with charges turns ON so that the current flows in a reverse direction from the output terminal OUT side toward the power supply line VCC in the output semiconductor element (MOS) 11. On this occasion, the current only flows into the output semiconductor element (MOS) 11 in a state in which ON resistance is low. Accordingly, the output semiconductor element (MOS) 11 can be prevented from heating.

Figure 9:
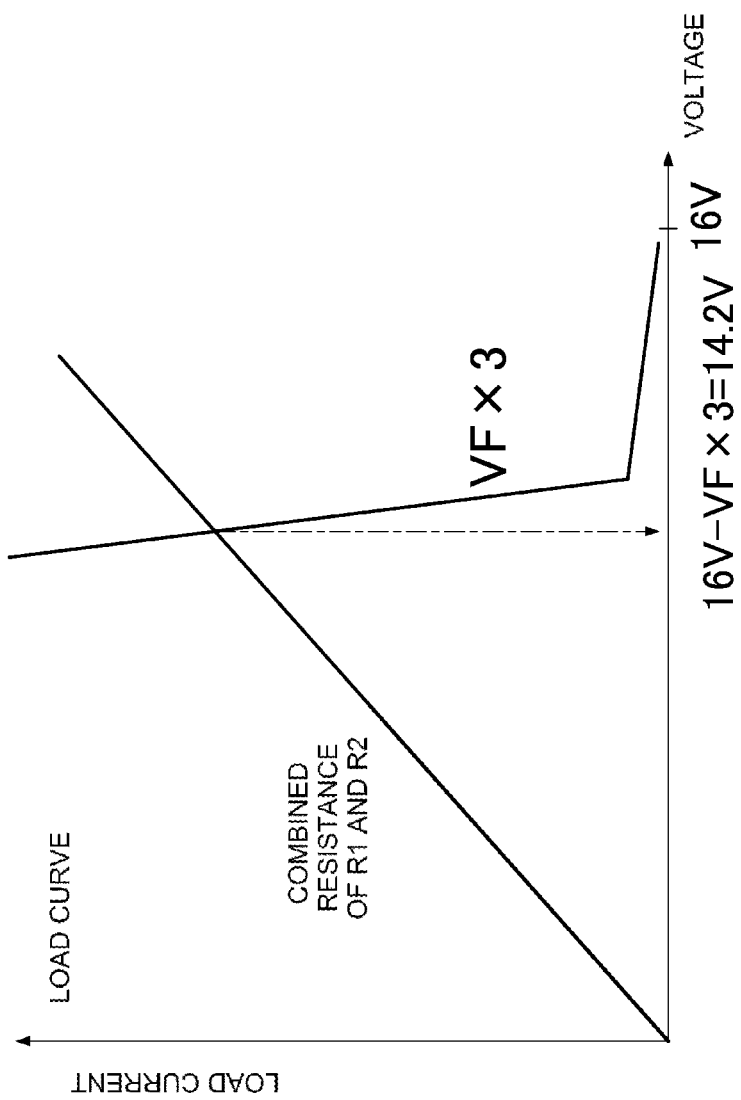
FIG. 9 is a graph showing load characteristic relative to a gate voltage of an output semiconductor element when the power supply is reversely connected.

Incidentally, a load characteristic concerned with the gate voltage of the output semiconductor element (MOS) 11 during the reverse connection is shown as in FIG. 9. Incidentally, assume here that the power supply voltage of the power supply BAT is set at 16V. As shown in FIG. 9, the load characteristic achieved by combined resistance of the resistors R1 and R2 is approximately linear to the change of the power supply voltage Vcc. On the other hand, the clamp voltage defined by the diodes D7, D8 and D9 is substantially constant regardless of the change of the power supply voltage Vcc. Accordingly, as to the gate voltage of the output semiconductor element (MOS) 11 during the aforementioned reverse connection, for example, the number of diodes D7, D8 and D9 which define the clamp voltage may be adjusted or polysilicon resistors etc. may be interposed in series with the diodes to thereby adjust the load characteristic of the clamp circuit 16 consisting of the diodes D7, D8 and D9.

Incidentally, the invention is not limited to the aforementioned embodiments. Here, the power supply devices 10, 20 and 30 each using an n-channel type power MOS-FET as the output semiconductor element 11 have been described. However, it is also a matter of course that the power supply device 10, 20 or 30 may be formed by use of an n-channel type IGBT. In addition, the invention can be likewise applied to a power supply device which uses a p-channel type power MOS-FET or IGBT to drive the inductive load RL with reverse polarities when the polarities of the battery supply are made reverse. In this case, it will go well as long as the polarities of each of the aforementioned elements are made reverse. Therefore, description does not have to be made again.

In addition, also as to the specific configuration of the control circuit 12, the control circuit 12 may have various functions as suggested in the background art. In short, the invention includes a clamp circuit which sets a clamp voltage against a negative voltage surge with reference to a ground voltage which defines an operation reference voltage of an output semiconductor element. Accordingly, the invention can be modified variously and carried out without departing from the spirit and scope of the invention.

What is claimed is:

1. A power supply device for use with an inductive load, comprising:
    a power supply line;
    an output conductor, the inductive load being connected to the output conductor;
    an output semiconductor element, including an insulated-gate semiconductor element configured to switch high electric power, that is connected between the power supply line and the output conductor;
    control means for driving and switching the output semiconductor element so as to supply electric power to the inductive load via the output conductor; and
    a clamp circuit which clamps a voltage applied between the power supply line and the output conductor due to a counter electromotive force with reference to an operation reference voltage of the output semiconductor element, the counter electromotive force being generated in the inductive load when the output semiconductor element turns OFF.

2. A power supply device according to claim 1, wherein:
    the clamp circuit includes a switch semiconductor element, an operation voltage setting diode, and a reverse flow preventing diode, the switch semiconductor element being connected between a gate of the insulated-gate semiconductor element and the power supply line through the reverse flow preventing diode, the operation voltage setting diode determining an ON-operation voltage of the switch semiconductor element with reference to the operation reference voltage of the insulated-gate semiconductor element.

3. A power supply device according to claim 2, wherein the output semiconductor element comprises an n-channel power metal-oxide-semiconductor field-effect transistor (MOS-FET) or an insulated-gate bipolar transistor (IGBT), and the switch semiconductor element comprises an n-channel MOS-FET.

4. A power supply device according to claim 2, wherein the clamp circuit further includes a resistor for pulling down a gate voltage of the insulated-gate semiconductor element to a voltage of the output conductor, the reverse flow protecting diode preventing a reverse flow of a current through the resistor.

5. A power supply device according to claim 2,
    wherein the clamp circuit includes a clamp voltage setting diode, an operation voltage setting diode, and a reverse flow preventing diode, the clamp voltage setting diode being connected between a gate of the insulated-gate semiconductor element and the power supply line through the reverse flow preventing diode, the operation voltage setting diode determining an ON-operation voltage of the switch semiconductor element with reference to the operation reference voltage of the insulated-gate semiconductor element, and wherein the clamp circuit further includes a first control semiconductor element and a second control semiconductor element, the first control semiconductor element cutting off the switch semiconductor element from the power supply line when the power supply line turns to a low voltage, the second control semiconductor element being connected between the gate of the insulated-gate semiconductor element and the power supply line through a clamp voltage setting diode in place of the switch semiconductor element.

6. A power supply device according to claim 5, wherein the second control semiconductor element clamps a voltage applied between the power supply line and the output conductor at a voltage set by the clamp voltage setting diode with reference to the voltage of the power supply line when the power supply line turns to a low voltage.

7. A power supply device according to claim 5, wherein:
the output semiconductor element comprises an n-channel power metal-oxide-semiconductor field-effect transistor (MOS-FET) or an insulated-gate bipolar transistor (IGBT);
the switch semiconductor element comprises an n-channel MOS-FET; and
the first and second control semiconductor elements comprise p-channel MOS-FETs controlled to turn ON/OFF complementarily.

8. A power supply device according to claim 1, further comprising a gate resistor;
wherein the insulated-gate semiconductor element of the output semiconductor element has a gate to which a control voltage is applied through the gate resistor so that the insulated-gate semiconductor element can turn ON/OFF to switch high electric power;
wherein the insulated-gate semiconductor element is provided with a discharge circuit which discharges charges accumulated in the gate of the insulated-gate semiconductor element when the insulated-gate semiconductor element turns OFF; and
wherein the clamp circuit further comprises a diode which is provided between a ground line defining an operation reference voltage of the insulated-gate semiconductor element and the gate of the insulated-gate semiconductor element and which clamps a gate voltage of the insulated-gate semiconductor element.

* * * * *